United States Patent
Shore

(10) Patent No.: US 9,672,939 B2
(45) Date of Patent: *Jun. 6, 2017

(54) MEMORY DEVICES, TESTING SYSTEMS AND METHODS

(71) Applicant: MICRON TECHNOLOGY, INC., Boise, ID (US)

(72) Inventor: Michael A. Shore, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/518,734

(22) Filed: Oct. 20, 2014

(65) Prior Publication Data

US 2015/0082106 A1 Mar. 19, 2015

Related U.S. Application Data

(63) Continuation of application No. 13/867,790, filed on Apr. 22, 2013, now Pat. No. 8,868,991, which is a continuation of application No. 12/721,346, filed on Mar. 10, 2010, now Pat. No. 8,429,470.

(51) Int. Cl.
*G11C 29/00* (2006.01)
*G11C 29/44* (2006.01)
*G11C 29/38* (2006.01)
*G11C 29/36* (2006.01)

(52) U.S. Cl.
CPC .............. *G11C 29/44* (2013.01); *G11C 29/36* (2013.01); *G11C 29/38* (2013.01); *G11C 29/4401* (2013.01); *G11C 29/883* (2013.01); *G11C 2229/723* (2013.01)

(58) Field of Classification Search
CPC ......... G11C 29/44; G11C 29/36; G11C 29/38; G11C 29/883; G11C 29/4401; G11C 2229/723
See application file for complete search history.

(56) References Cited

U.S. PATENT DOCUMENTS

| 4,369,510 A | * | 1/1983 | Johnson | .................. G06F 11/00 714/49 |
| 7,249,296 B2 | | 7/2007 | Hirabayashi | |
| 8,429,470 B2 | | 4/2013 | Shore | |

(Continued)

OTHER PUBLICATIONS

Karim, et al., "Protected Storage-Write Mask to Protect a Region of Memory from Processor Writes", IBM (TDB v36 n8 Aug. 1993), Aug. 1, 1993, 635-636.

*Primary Examiner* — April Y Blair
*Assistant Examiner* — Thien D Nguyen
(74) *Attorney, Agent, or Firm* — Dorsey & Whitney LLP

(57) ABSTRACT

Testing systems and methods, as well as memory devices using such testing systems and methods, may facilitate testing of memory devices using a read-modify-write test procedure. One such testing system receives a signal indicative of at least some of a plurality of bits of data read from an address differing from each other, and then masks subsequent write operations at the same address. Therefore, any address at which the bits of read data do not all have the same value may be considered to be faulty. Failure data from the test can therefore be stored in the same array of memory cells that is being tested.

20 Claims, 4 Drawing Sheets

(56) References Cited

U.S. PATENT DOCUMENTS

| | | | |
|---|---|---|---|
| 2003/0033557 A1* | 2/2003 | Okazaki | G11C 29/56 |
| | | | 714/27 |
| 2003/0043664 A1* | 3/2003 | Haraguchi | G11C 29/44 |
| | | | 365/201 |
| 2004/0042312 A1 | 3/2004 | Kim et al. | |
| 2004/0237001 A1* | 11/2004 | Schulz | G06F 11/1008 |
| | | | 714/42 |
| 2006/0256637 A1 | 11/2006 | Takahashi et al. | |
| 2008/0046788 A1 | 2/2008 | Lee et al. | |
| 2008/0201621 A1* | 8/2008 | Sato | G11C 29/56 |
| | | | 714/718 |
| 2009/0083592 A1 | 3/2009 | Tanaka et al. | |
| 2009/0167377 A1 | 7/2009 | Takano | |
| 2009/0204739 A1 | 8/2009 | Gronlund | |
| 2009/0225611 A1* | 9/2009 | Cha | G11C 29/1201 |
| | | | 365/201 |
| 2009/0327800 A1* | 12/2009 | Kim | G06F 11/1044 |
| | | | 714/5.11 |
| 2010/0042878 A1 | 2/2010 | Kanasugi | |
| 2010/0058126 A1 | 3/2010 | Chang et al. | |
| 2010/0067312 A1* | 3/2010 | Lee | G11C 29/44 |
| | | | 365/189.07 |
| 2011/0225471 A1 | 9/2011 | Shore | |
| 2013/0232386 A1 | 9/2013 | Shore | |

\* cited by examiner

MEMORY DEVICES, TESTING SYSTEMS AND METHODS

CROSS-REFERENCE TO RELATED APPLICATIONS

This application is a continuation of U.S. patent application Ser. No. 13/867,790, filed on Apr. 22, 2013, which is a continuation of U.S. patent application Ser. No. 12/721,346, filed Mar. 10, 2010, which issued as U.S. Pat. No. 8,429,470 on Apr. 23, 2013. This application is incorporated herein by reference in its entirety and for any purpose.

TECHNICAL FIELD

Embodiments of this invention relate to memory devices, and, more particularly to memory devices having on-board test capabilities as well as testing methods and systems.

BACKGROUND

During the fabrication of integrated circuits such as memory devices, it is conventional to test such integrated circuits at several stages during the fabrication process. For example, after fabrication, integrated circuits may be connected to a tester with a probe card when the integrated circuits are still in wafer form. In a final test occurring after the integrated circuits have been diced from the wafer and packaged, the integrated circuits may be placed into sockets on a load board or other device and once again tested.

As is well-known in the art, memory devices may be provided with circuitry that allows limited repair of defects in the memory devices. Such repair devices may allow defects to be repaired at specific addresses. Once the addresses that include a defect have been determined (i.e., once the address at which respective defects are located have been obtained by testing), the defects may then be repaired.

Memory devices are conventionally tested during fabrication and after packaging using high-speed automated testers. The testers typically having a single data input/output ("I/O") bus, which is normally coupled to several memory devices during a test. Although data may be simultaneously written to all of the memory devices, data may not be simultaneously read from all of the memory devices or else several memory devices may simultaneously apply read data to the I/O bus of the tester. To avoid this bus contention problem, data may be read from each of the memory devices in sequence, thereby requiring multiple read cycles to read the data from all of the memory devices. Further, conventional testers for memory devices are very expensive, and using a separate tester to test each memory device individually would require a very large number of testers in a high volume memory device fabrication environment. To limit the cost of memory device testing, memory testers may test a large number of devices in parallel. In these situations, a tester may transmit write commands, addresses and data to a large number of memory devices in parallel, thus writing the same data to the same locations in all of the memory devices. The memory devices may then read to determine if the read data matches the write data. If the data read at any address does not match the data written to that address, then a defect at that address is considered to exist.

One problem with testing memory devices using the above-described techniques is that it may be necessary to read data from each memory device individually to determine if data read from each address is in error. Doing so can greatly limit the rate at which a tester can test memory devices. As a result, attempts have been made to provide memory devices with limited on-board test capabilities. One approach has been to provide comparison circuitry in the memory device itself to avoid the need to couple read data from the memory device for evaluation. A large number of memory devices may be coupled to a tester in parallel. The tester may simultaneously write data to each address in all of the memory devices, and the memory device subsequently compares the data written to each address with the data read from that address. In another approach, bits of the data read responsive to a memory request may be compared to each other to detect and error, or the correct comparison bits may be supplied to the memory devices by the tester with the read commands. In any case, a bit indicative of an error can be stored in an on-board storage device, such as a latch. Address bits corresponding to the location of the defect causing the error can also be stored in an on-board storage device. The on-board storage devices can then be read at the conclusion of the test to determine the addresses where errors have been detected, and those addresses can then be repaired by conventional means. Unfortunately, it can require a significant number of storage devices, such as latches, to store all of the address bits for each of a large number of addresses that are to be repaired by conventional means. As a result, the storage capacity and/or cost of memory devices can be adversely affected by the need to provide a large amount of circuitry to store error data.

DETAILED DESCRIPTION

Figure 1:
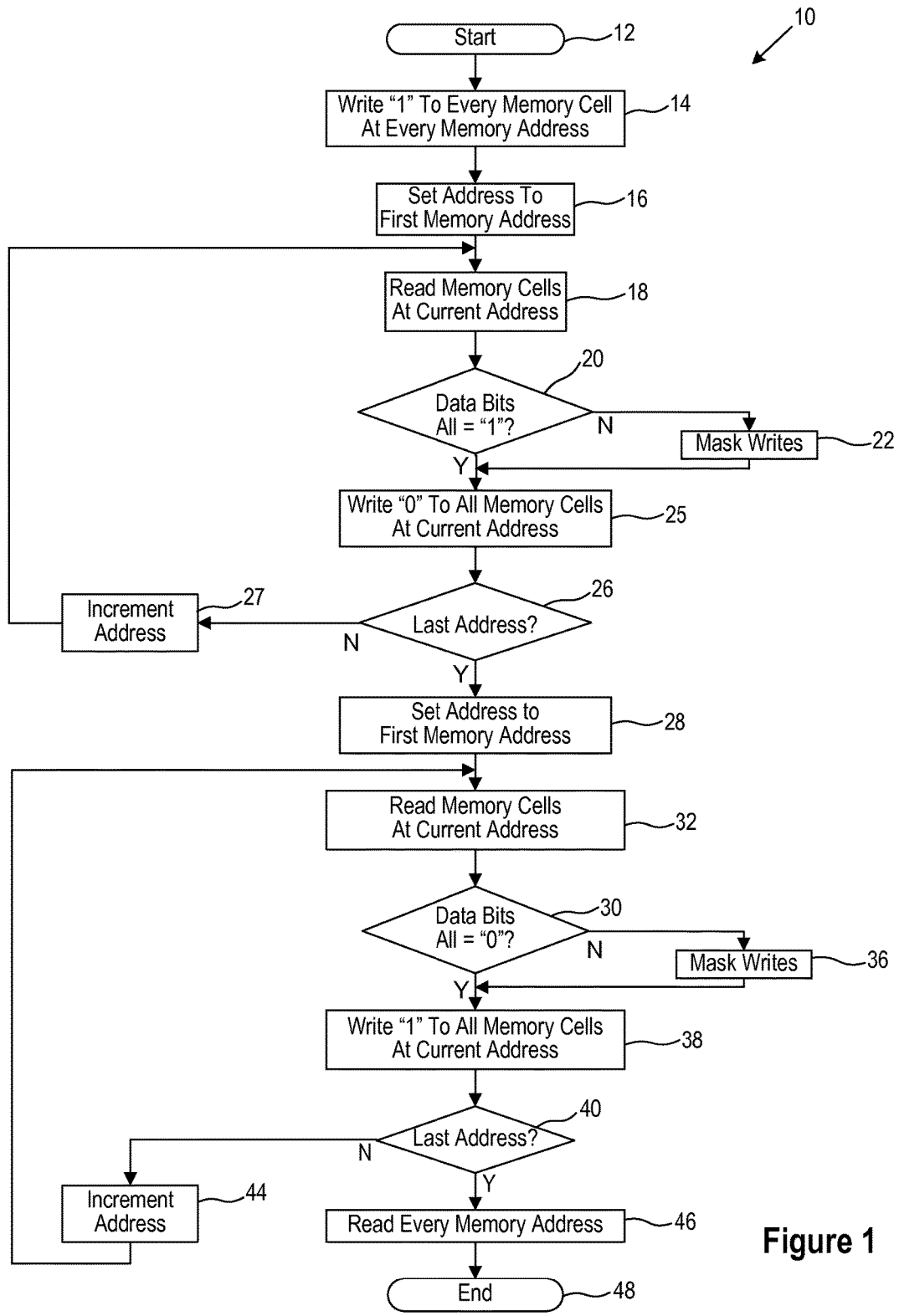
FIG. 1 is a flowchart showing a read-modify-write test procedure according to one embodiment.

Various embodiments of memory device testing systems and methods may be used by performing a standard "read-modify-write" test procedure. One example of a suitable read-modify-write procedure 10 is illustrated in FIG. 1. The test starts at 12, and specific data, such as a logic "1" bit, may be written to every memory cell of every memory address in an array at step 14. The number of memory cells at each address may vary from one memory device to another, but it commonly corresponds to a number of data bus terminals or the product of the number of data bus terminals and a number of serial bits that are coupled to or from each data bus terminal for each write or read access. An internal address counter (not shown) may then be set to the address of a first memory cell at step 16. A read memory operation may then be initiated at the current address at step 18. A determination may then be made at step 20 whether all of the read data bits are a "1." If not, a write mask signal may be generated at step 22 to preserve the failing state of the data that would otherwise be written to at the current address, as explained below. If it was determined at step 20 that all of the read data bits were a "1," the write mask signal is not generated at step 22 so that a "0" may be written to all memory cells currently being addressed at step 25. The process may then advance to step 26 as explained below. If the memory cells being read correctly store the data (e.g., the cells store the specific data without error), the read data bits will all be "1." A check is then made at step 26 to determine if the read at step 18 was at the last address in the memory device. If not, the address is incremented at step 27, and the process again progresses through steps 18-26 as exampled above.

If the determination is made at step 26 that the last address was read, the current address may be set to the first memory address at step 28. Therefore, if the 4 bits read at step 18 were found to be "1111" at step 20, then the data stored at the current address will now be "0000." The memory cells at the current address may again be read at step 32. A logic "0" should normally be read from each of the non-failing memory cells being addressed at step 32 because a "0" was written to all of the non-failing memory cells at step 25. A determination may be made at step 30 whether all of the read data bits are a "0." If a "1" is read from any of the memory cells being addressed in step 30, a write mask signal may be generated at step 36 to preserve the failing state of the data that would otherwise be written to at the current address, as explained below. If it was determined at 30 that all of the read data bits were a "0," the write mask signal is not generated at step 36 so that a "1" may be written to all memory cells currently being addressed at step 38. The process may advance to step 40 without the memory address being masked since there may be no additional writes at the current address that may require masking. On the other hand, if all of the read data bits are read as a "0" at step 30, a "1" may be written to all memory cells currently being addressed at step 38. On the other hand, for example, if "1101" was read at an address at step 30, then the data stored at the current address will continue to be "1101." Thus, if the incorrect data was read at either step 18 or 28, the data bits stored at the corresponding address should be a combination of "1" and "0" bits. On the other hand, if the correct data was read at both step 18 and step 28, the data bits stored at the corresponding address should be "1111" after step 38 has been completed. A determination may then be made at step 40 whether the memory cells being addressed is the last memory address in the array. If not, the address may be incremented at step 44 before returning to step 32 where the memory cell corresponding to the new address may be read. The above procedure again repeats until a determination is made at step 40 that the memory cells currently being addressed are the last memory cells in the array. After the above procedure has been completed for all memory cells in the array, the entire array may be read at step 46, and the process may then terminate at step 48. Any address that contains any "0" bit may be considered an address that may include a defect, and that should be repaired by suitable means, such as by remapping the address to a redundant row or column of memory cells. Although the particular bit that is storing a "0" may identify a specific defective memory cell at that address, the identity of the specific defective memory cell may not be required since memory cell defects may generally be repaired on an address-by-address basis rather than a cell-by-cell basis.

It can therefore be seen that, at the conclusion of the test, all of the test failure data from the test may be stored in the very same array that was tested by the read-modify-write test procedure. There may be thus no limit to the amount of test failure data that can be stored, and no additional storage components, such as latches, may be required to store this failure data. In contrast, as mentioned above, prior art memory device would trigger a latch or other device at steps 22 and 36 to store the address that resulted in the incorrect data being read. Unfortunately, the amount of space consumed on a semiconductor die by the number of latches needed to store all of the data bits of each address or even each address may preclude a large number of addresses that include a defect from being stored. As a result, prior art read-modify-write test procedures may sometimes be inadequate.

Figure 2:
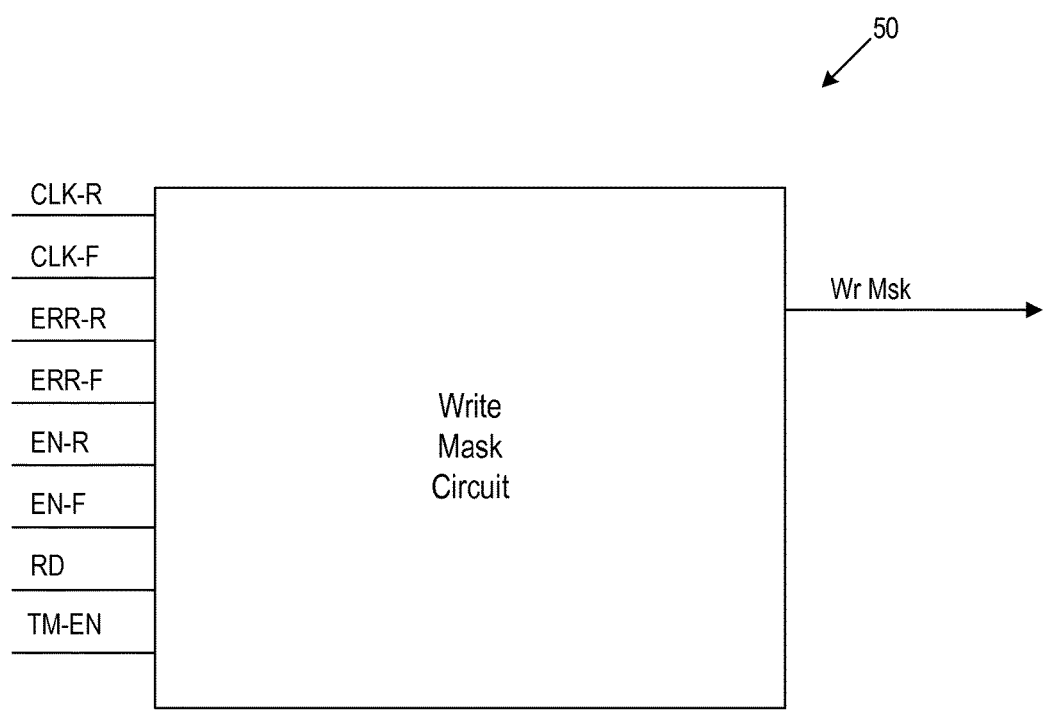
FIG. 2 is a block diagram of a write mask system according to one embodiment.

One embodiment of a system 50 for providing write mask signals responsive to detecting a read data error is shown in FIG. 2. With reference to FIG. 2, the system 50 may receive an active high TM-EN signal, which transitions high during the "read-modify-write" test procedure to enable failure data to be stored in the array of memory cells being tested. Thereafter, active high CLK-R and CLK-F signals, which are generally available in conventional memory devices, may be applied to the system 50. The CLK-R and CLK-F signals are clock signals that may transition high each time a comparison is made in the memory device between data written to a memory address during respective rising and falling edges of a write data strobe signal, and corresponding data may be subsequently read from that same address. The system 50 may also receive active high ERR-R and ERR-F signals, which are also signals that are available in conventional memory devices to indicate when at least one of a set of data bits read at respective rising and falling edges of an internal clock signal is in error. The system 50 may also receive active high EN-R and EN-F signals available in conventional memory devices to indicate when respective rising edge and falling edge read data has been evaluated by circuitry in the memory device to determine if the read data are in error. Finally, the system 50 may receive the active high RD signal, which may also be available in conventional memory devices to indicate the start of a memory read operation.

In operation, the TM-EN signal may be set high to enable failure data to be stored in the memory array being tested using a "read-modify-write" test procedure, such as the test procedure shown in FIG. 1. A logic "1" data bit may then be written to all of the memory cells at each memory address of the memory array, as explained above with respect to step 14 of FIG. 1. Thereafter, the RD signal may transition high, and data may be read from the memory cells at the first address of the memory array being tested during either the rising edge or the falling edge of the internal clock signal. When either the EN-R or the EN-F signal, respectively, transitions high, if any of the data bits read at step 18 (FIG. 1) was a low, the ERR-R or ERR-F signal will be active high. In such case, the WrMsk signal at the output of the system 50 may transition high on the rising edge of either the CLK-R or the CLK-F signal, respectively. The active high WrMsk signal may be applied to conventional circuitry commonly found in conventional memory devices to mask data from being written to the memory array being tested for as long as the WrMsk signal is high. Therefore, the writing of a logic "0" to the memory cell being tested at step 26 may be suppressed. The system 50 may operate in essentially the same manner when the data bits are read at step 28 (FIG. 1) and data bits may be written at step 38 unless the write was masked at step 36.

Although the embodiment exemplified by the system 50 uses a specific set of signals providing specific functions to cause failure data to be stored in the array being tested, it will be understood that other embodiments may use a fewer or greater number of other signals providing the same or different functions to cause failure data to be stored in the array being tested.

Figure 3:
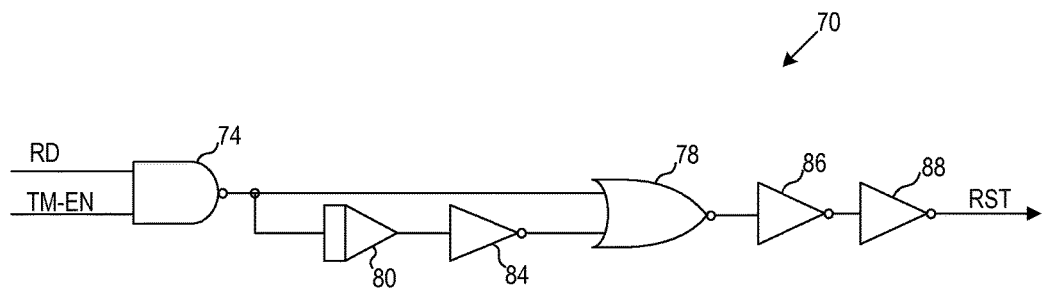
FIG. 3 is a logic diagram of a portion of a write mask circuit according to another embodiment.
Figure 4:
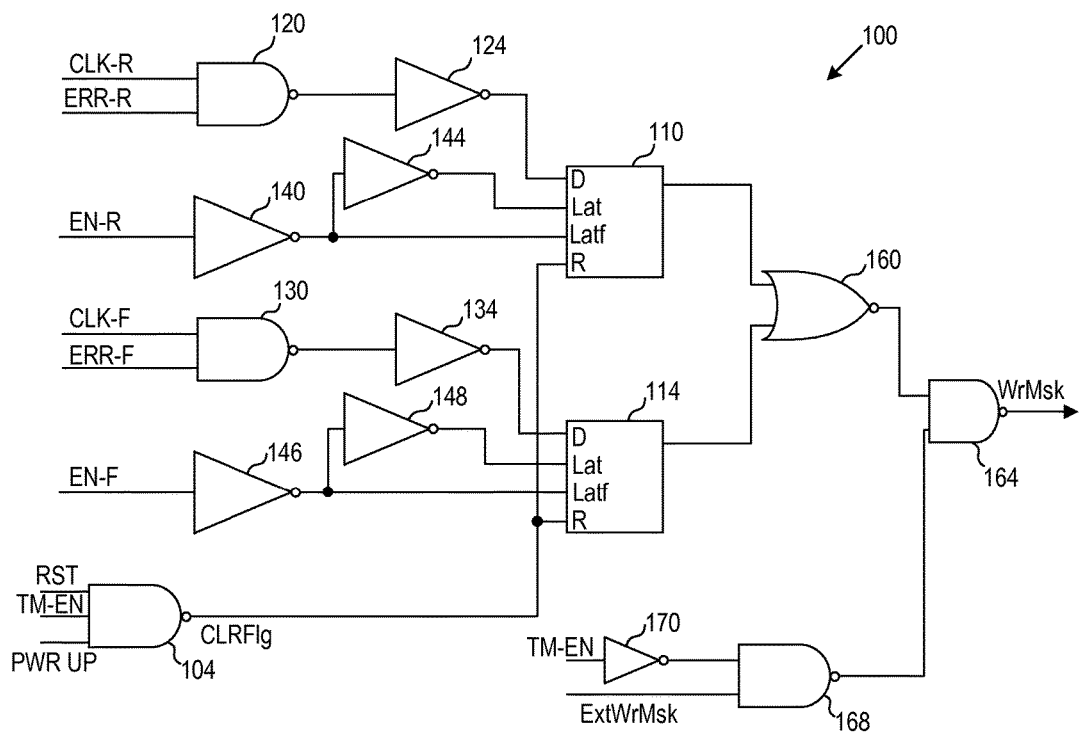
FIG. 4 is a block diagram of the remaining portion of the write mask circuit embodiment of FIG. 3.

An embodiment of the system 50 of FIG. 2 for providing write mask signals is shown in FIGS. 3 and 4. With reference to FIG. 3, a one-shot circuit 70 includes a NAND gate 74 that receives the RD signal and the TM-EN signal. As explained above, the TM-EN signal may transition to enable the above-described test procedure. The RD signal may transition high at the start of a read operation when data may be read from a current address. Thus, when the test mode is enabled, the output of the NAND gate 74 may transition low. This low may be applied directly to one input of a NOR gate 78 and to the other input of the NOR gate 78 through a delay circuit 80 and an inverter 84. Before the RD signal has transitioned high at the start of a read operation, the output of the NAND gate 74 may be high so that the output of the inverter 84 will be low. The output of the inverter 84 may remain low for a period because of the delay circuit 80 when the output of the NAND 74 transitions low at the start of a read operation. As a result, the output of the NOR gate 78 may transition high for a period determined by the delay of the delay circuit 80. The output of the NOR gate 78 may be coupled through two inverters 86, 88 to generate a reset ("RST") signal. Thus, the RST signal may pulse high at the start of every read operation.

The RST pulse from the one-shot 70 may be applied to a write mask circuit 100, which is shown in FIG. 4. More specifically, the RST pulse may be applied to one input of a NAND gate 104, which also has inputs receiving the TM-EN signal and a PWRUP signal whenever a supply voltage in the memory device has stabilized. The output of the NAND gate 104 may generate an active low clear flag ("CLRFlg") signal. Therefore, the CLRflg signal may pulse low responsive to the RST pulse whenever the test mode is enabled and the supply voltage has stabilized.

With further reference to FIG. 4, the write mask circuit 100 may include a pair of latches 110, 114 each of which has a data ("D") input. The D input of the latch 110 may be coupled to the output of a NAND gate 120 through an inverter 124. One input of the NAND gate 120 may receive the CLK-R signal while the other input of the NAND gate 120 may receive the ERR-R signal. As explained above with reference to FIG. 2, the CLK-R signal is a clock signal that transitions high each time a comparison is made in the memory device between data written to a memory address during a rising edge of a write data strobe signal, and corresponding data may be subsequently read from that same address. As also explained above, the ERR-R is a signal available in conventional memory devices to indicate when at least one of the data bits read responsive to the rising edge of an internal clock signal is in error. Thus, if the data being read from a memory array responsive to the rising edge of an internal clock signal at an address contains an erroneous data bit, the D input of the latch 110 will transition high at the rising edge of the CLK-R signal.

The D input of the latch 114 may be coupled to circuitry that is identical to the circuitry to which the D input of the latch 110 is coupled. Specifically, the D input may be coupled to a NAND gate 130 through an inverter 134, the inputs of the NAND gate 130 receive the CLK-F signal and the ERR-F signal. Therefore, if the data being read from a memory array responsive to the falling edge of an internal clock signal at an address contains an erroneous data bit, the D input of the latch 110 will transition high at the rising edge of the CLK-F signal.

Each of the latches 110, 114 also includes an active high latch input Lat and an active low Latf input which causes a logic level applied to a data D input to be stored in the respective latch 110, 114. The Latf input of the latch 110 may be coupled to the output of an inverter 140, and the Lat input may be coupled to the output of an inverter 144, which has an input coupled to the output of the inverter 140. The input of the inverter 140 receives the EN-R signal, which, as explained above, is a signal that is available in conventional memory devices to indicate when the data read responsive to the rising edge of an internal clock signal has been evaluated by circuitry in the memory device to determine if the read data are in error. Thus, in response to the rising edge of the EN-R signal, a logic "0" will be stored in the latch 110 if none of the bits of the read data is in error, and a logic "1" will be stored in the latch 110 if any of the bits of the read data is in error. Similarly, The Latf input of the latch 114 may be coupled to the output of an inverter 146, and the Lat input may be coupled to the output of an inverter 148, which has an input coupled to the output of the inverter 140. The input of the inverter 146 receives the EN-F signal, which, as explained above, is a signal that is available in conventional memory devices to indicate when the data read responsive to the falling edge of an internal clock signal has been evaluated by circuitry in the memory device to determine if the read data are in error. Thus, in response to the rising edge of the EN-F signal, a logic "0" may be stored in the latch 114 if none of the bits of the read data is in error, and a logic "1" may be stored in the latch 114 if any of the bits of the read data is in error.

The final input to the latches 110, 114 is an active low reset ("R") input, which may be coupled to receive the ClrFlg signal from the output of the NAND gate 104. As explained above, the CLRFlg signal may pulse low responsive to the RST pulse whenever the test mode is enabled and the supply voltage has stabilized. As also explained above, the RST pulse may be generated at the start of any memory read operation. Thus, the latches 110, 114 may be reset at the start of any memory read operation.

The outputs of the latches 110, 114 may be applied to respective inputs of a NOR gate 160. Therefore, if either latch 110, 114 is set responsive to detecting a read in error, the output of the NOR gate 160 may be low. The output of the NOR gate 160 may be applied to an input of a NAND gate 164 which receives the output on a NAND gate 168 at its other input. The NAND 168 may receive the TM-EN signal through an inverter 170 so that the NAND gate 168 is disabled to enable the NAND gate 164 whenever the test mode is enabled. The other input of the NAND gate 168 may receive an external write mask signal ("ExtWrMsk"), which is normally present in conventional memory devices whenever a write operation is to be masked. Thus, when the test mode is enabled, an active high mask write signal ("WrMsk") may be generated whenever either of the latches 110, 114 is set responsive to detecting a data read error. When the test mode is inactive, the WrMsk may be generated responsive to the ExtWrMsk signal. As explained above, the WrMsk signal is normally generated in conventional memory devices responsive to the ExtWrMsk write mask signal to mask a data write operation. However, using the write mask circuit 100, the WrMsk may also be generated whenever a read data error is detected during a test procedure, such as the read-modify-write test procedure 10 shown in FIG. 1.

Figure 5:
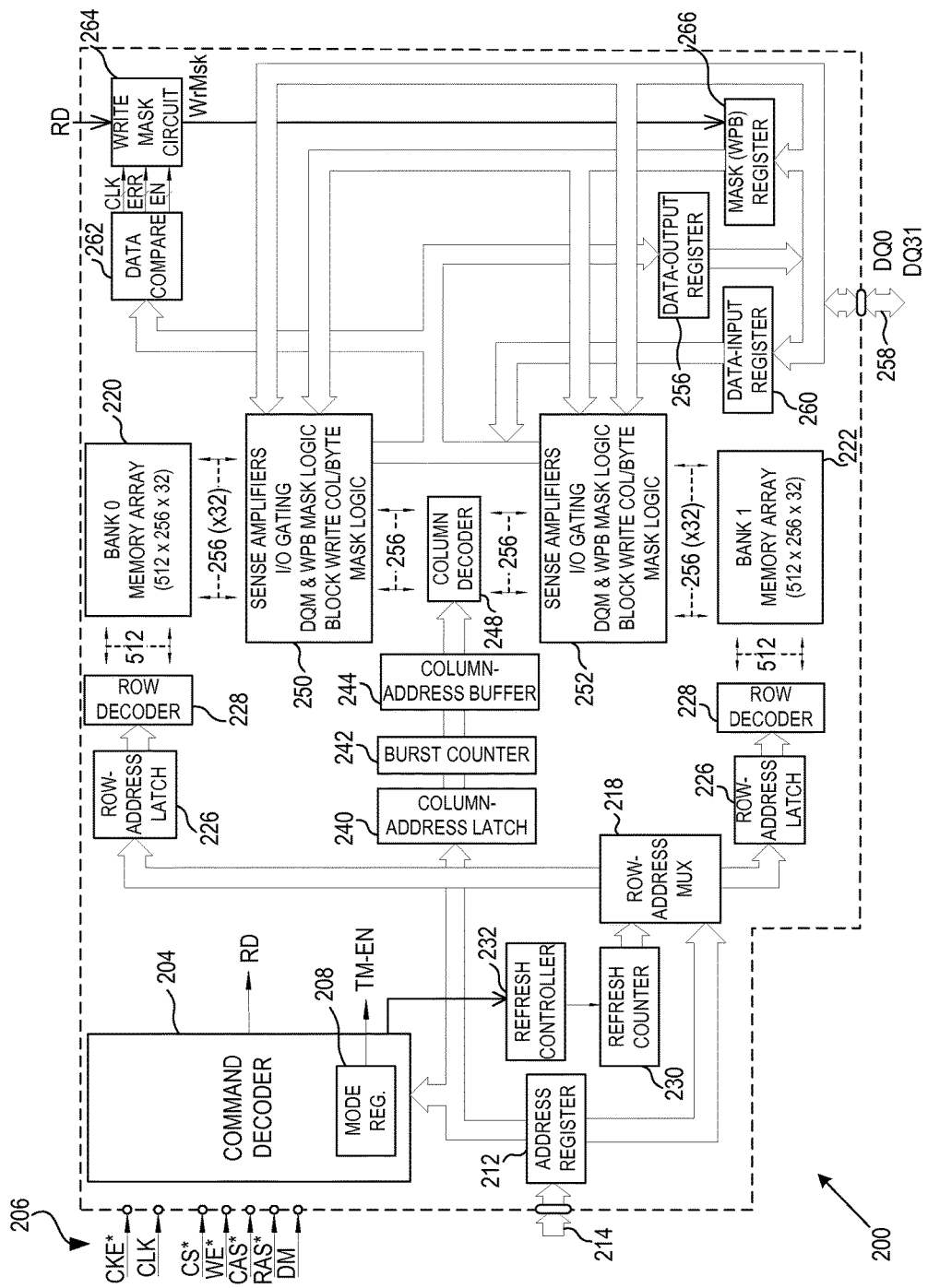
FIG. 5 is a block diagram of an embodiment of a memory device that can be used with various embodiments of a write mask circuit.

Various embodiments of the write mask circuit can be used in virtually any memory device in which a write mask operation is possible, including dynamic random access memory ("DRAM") devices, flash memory devices, and static random access memory ("SRAM") devices, to name a few. For example, as shown in FIG. 5, a conventional synchronous dynamic random access memory ("SDRAM")

200 may use various embodiments of a write mask circuit. The operation of the SDRAM 200 is controlled by a command decoder 204 responsive to high-level command signals received on a control bus 206. The command decoder 204 generates a sequence of command signals responsive to the high level command signals to carry out the function (e.g., a read or a write) designated by each of the high level command signals. These command signals include the RD signal, which transitions active high at the start of read operations. The command decoder 204 may also include a mode register 208 that can be programmed to generate the test mode enable TM-EN signal.

The SDRAM 200 includes an address register 212 that receives row addresses and column addresses through an address bus 214. The address bus 214 is generally coupled to a memory controller (not shown in FIG. 5). A row address is generally first received by the address register 212 and applied to a row address multiplexer 218. The row address multiplexer 218 couples the row address to a number of components associated with either of two memory banks 220, 222 depending upon the state of a bank address bit forming part of the row address. Associated with each of the memory banks 220, 222 is a respective row address latch 226, which stores the row address, and a row decoder 228, which decodes the row address and applies corresponding signals to one of the arrays 220 or 222. The row address multiplexer 218 also couples row addresses to the row address latches 226 for the purpose of refreshing the memory cells in the arrays 220, 222. The row addresses may be generated for refresh purposes by a refresh counter 230, which is controlled by a refresh controller 232. The refresh controller 232 is, in turn, controlled by the command decoder 204.

After the row address has been applied to the address register 212 and stored in one of the row address latches 226, a column address is applied to the address register 212. The address register 212 couples the column address to a column address latch 240. Depending on the operating mode of the SDRAM 200, the column address is either coupled through a burst counter 242 to a column address buffer 244, or to the burst counter 242, which applies a sequence of column addresses to the column address buffer 244 starting at the column address output by the address register 212. In either case, the column address buffer 244 applies a column address to a column decoder 248.

Data to be read from one of the arrays 220, 222 is coupled to column circuitry 250, 252, which may include sense amplifiers, I/O gating, DQM &WPB mask logic, block write col/byte mask logic) for one of the arrays 220, 222, respectively. The data bits developed by the sense amplifiers may then be coupled to a data output register 256. Data to be written to one of the arrays 220, 222 may be coupled from the data bus 258 through a data input register 260. The write data may be coupled to the column circuitry 250, 252 where they may be transferred to one of the arrays 220, 222, respectively. The memory device 200 also includes a data compare circuit 262 that serves as an error detect circuit by comparing sets of data bits read from the memory banks 220, 222 to determine if they all have the same logic level. If not, the data compare circuit 262 may generate ERR-R and ERR-F signals, as described above. The data compare circuit 262 may also generate the CLK-R and CLK-F signals and the EN-R and EN-F signals, which are also described above. These signals may be applied to a write mask circuit 264, which generates the WrMsk signal to mask data write operations. The WrMsk signal is applied to a mask register 266 to selectively block the flow of write data to the column circuitry 250, 252.

Although the present invention has been described with reference to the disclosed embodiments, persons skilled in the art will recognize that changes may be made in form and detail without departing from the invention. Such modifications are well within the skill of those ordinarily skilled in the art. Accordingly, the invention is not limited except as by the appended claims.

What is claimed is:

1. An apparatus, comprising:
   an array of memory cells; and
   error detect circuitry configured to provide an error signal having a value indicating an error responsive to detecting a read data error associated with a memory cell of the array of memory cells, and wherein the array of memory cells is configured to store error data in and prevent writing to the memory cell of the array of memory cells with which the read data error is associated by applying a write mask only to the memory cell of the array of memory cells with which the read data error is associated.

2. The apparatus of claim 1, wherein the error detect circuitry is further configured to provide the error signal having a value indicating no error responsive to detecting correct read data associated with the memory cell of the array of memory cells.

3. The apparatus of claim 1, further comprising a write mask circuit configured to provide a write mask signal responsive to receiving the error signal having the value indicating the error.

4. The apparatus of claim 3, wherein the write mask circuit is configured to preserve the error data in the memory cell of the array of memory cells with which the read data error is associated during a write operation on the array of memory cells.

5. The apparatus of claim 3, wherein the write mask circuit is further configured to not provide the write mask signal responsive to the error signal having the value indicating no error.

6. The apparatus of claim 3, further comprising reset logic coupled to the write mask signal and configured to provide a reset signal responsive to a test enable signal, wherein the write mask circuit is configured to reset the write mask signal responsive to the reset signal.

7. A method, comprising:
   reading first data stored at a memory cell associated with an address;
   determining, with error detect circuitry, whether the memory cell associated with the address correctly stored first data; and
   if the memory cell did not correctly store the first data, causing a record of a storage error to be stored at the memory cell associated with the address by applying a write mask only to the memory cell associated with the address, wherein the record of the storage error identifies the individual memory cell associated with the address.

8. The method of claim 7, wherein causing a record of the storage error to be stored at the memory cell associated with the address comprises masking with a mask circuit subsequent write operations at the address.

9. The method of claim 7, wherein the memory cell associated with the address is included in a memory array.

10. The method of claim 9, further comprising remapping the address to a redundant memory cell included in the memory array if the memory cell did not correctly store the first data.

11. The method of claim 9, wherein the memory cell associated with the address is remapped to a redundant memory cell included in the memory array if the memory cell did not correctly store the first data.

12. The method of claim 7, further comprising, executing, with the error detect circuitry, a read-modify-write procedure on a memory array associated with the memory cell.

13. The method of claim 12, further comprising, masking with a mask circuit subsequent write operations if the memory cell did not correctly store the first data.

14. The method of claim 7, further comprising writing second data to the memory cell associated with the address if the memory cell associated with the address correctly stored the first data.

15. The method of claim 14, further comprising determining, with error detect circuitry, whether the memory cell associated with the address correctly stored the second data.

16. A method, comprising:
reading first data stored in an array of memory cells in a memory device corresponding to a plurality of memory addresses;
determining, with error detect circuitry, whether individual memory cells of the array of memory cells in the memory device corresponding to the plurality of memory addresses correctly stored the first data; and
responsive to determining the memory cells incorrectly stored the first data, causing a record of the storage errors to be stored in the individual memory cells of the array of memory cells by applying a write mask only to individual memory cells of the array of memory cells that incorrectly stored the first data.

17. The method of claim 16, wherein causing a record of the storage errors to be stored in the array of memory cells comprises masking at a mask circuit the writing of second data to the memory cells of the array of memory cells that were masked responsive to determining the memory cells incorrectly stored the first data.

18. The method of claim 17, further comprising writing the second data to unmasked memory cells of the array of memory cells.

19. The method of claim 16, further comprising writing second data to the array of memory cells responsive to determining, with the error detect circuitry, that the array of memory cells correctly stored the first data.

20. The method of claim 19, further comprising determining, with error detect circuitry, whether the array of memory cells in the memory device corresponding to the plurality of memory addresses correctly stored the second data.

* * * * *